United States Patent
Hsiang et al.

(10) Patent No.: US 9,978,629 B1
(45) Date of Patent: May 22, 2018

(54) METHOD OF TRANSFERRING MICRO DEVICES AND MICRO DEVICE TRANSFER APPARATUS

(71) Applicant: Acer Incorporated, New Taipei (TW)

(72) Inventors: Jui-Chieh Hsiang, New Taipei (TW); Chih-Chiang Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days. days.

(21) Appl. No.: 15/649,623

(22) Filed: Jul. 13, 2017

(30) Foreign Application Priority Data

Apr. 12, 2017 (TW) .............................. 106112113 A

(51) Int. Cl.
*H01L 21/683* (2006.01)
*H01L 25/075* (2006.01)
*H01L 33/62* (2010.01)
*H01L 33/00* (2010.01)

(52) U.S. Cl.
CPC ...... *H01L 21/6835* (2013.01); *H01L 25/0753* (2013.01); *H01L 33/00* (2013.01); *H01L 33/62* (2013.01); *H01L 2221/68363* (2013.01); *H01L 2221/68381* (2013.01); *H01L 2933/0066* (2013.01)

(58) Field of Classification Search
None
See application file for complete search history.

(56) References Cited

U.S. PATENT DOCUMENTS

| 8,333,860 | B1 | 12/2012 | Bibl et al. | |
| 8,569,115 | B1 | 10/2013 | Golda et al. | |
| 2005/0232728 | A1 | 10/2005 | Rice et al. | |
| 2013/0130440 | A1* | 5/2013 | Hu | H01L 24/83 438/107 |
| 2014/0158415 | A1 | 6/2014 | Golda et al. | |

* cited by examiner

*Primary Examiner* — Asok K Sarkar
(74) *Attorney, Agent, or Firm* — JCIPRNET

(57) ABSTRACT

A method of transferring micro devices is provided. A carrier substrate including a plurality of first electrodes and a plurality of micro devices is provided. The micro devices are separated from each other and respectively electrically connected to the first electrodes. A receiving substrate is made to relatively close to the carrier substrate. The receiving substrate includes a plurality of second electrodes, and the second electrodes and the first electrodes are opposite in electrical property. A first voltage and a second voltage are applied to a portion of the adjacent two first electrodes, so that the micro devices are released from the carrier substrate to the receiving substrate and bonded to the receiving substrate. The first voltage is different from the second voltage. In addition, a micro devices transfer apparatus is also provided.

17 Claims, 16 Drawing Sheets

METHOD OF TRANSFERRING MICRO DEVICES AND MICRO DEVICE TRANSFER APPARATUS

CROSS-REFERENCE TO RELATED APPLICATION

This application claims the priority benefit of Taiwan application serial no. 106112113, filed on Apr. 12, 2017. The entirety of the above-mentioned patent application is hereby incorporated by reference herein and made a part of this specification.

BACKGROUND OF THE INVENTION

Field of the Invention

The invention relates to a transfer method and a transfer apparatus, and particularly relates to a method of transferring micro devices and a micro device transfer apparatus.

Description of Related Art

Micro light-emitting diode (LED) display device has advantages of high brightness, high contrast, wide viewing angle, long service life, low power consumption, etc., and has become a focus in development of future display techniques. Since process variation is generally encountered in a current manufacturing process to cause a problem of poor brightness/chroma uniformity of LED, a massive transfer method is gradually developed to resolve the aforementioned problem.

Presently, the massive transfer method has to transfer micro LEDs from a carrier substrate to a receiving substrate through a transfer transmission head with high alignment accuracy. Since a size of the transfer transmission head has to be accurately matched to a size of the LED in order to achieve high alignment accuracy transfer, it is difficult in implementation, an alignment shift of the transfer is generally occurred during a transfer process, which causes errors of the transfer process. Therefore, how to achieve the purpose of massively transferring micro devices, and meanwhile improve the alignment accuracy to decrease the errors of the transfer process is currently one of the issues of concern in the industry.

SUMMARY OF THE INVENTION

The invention is directed to a method of transferring micro devices and a micro device transfer apparatus, which have higher alignment accuracy and errors occurred in a transfer process are decreased.

The invention provides a method of transferring micro devices including following steps. A carrier substrate is provided, the carrier substrate is configured with a plurality of first electrodes and a plurality of micro devices, where the micro devices are separated from each other and respectively electrically connected to the first electrodes. A receiving substrate is made to relatively close to the carrier substrate, the receiving substrate is configured with a plurality of second electrodes, and the second electrodes and the first electrodes are opposite in electrical property. A first voltage and a second voltage are applied to a portion of the adjacent two first electrodes, so that the micro devices are released from the carrier substrate to the receiving substrate and bonded to the receiving substrate. The first voltage is different to the second voltage.

In an embodiment of the invention, while the first voltage and the second voltage are applied to the portion of the adjacent two first electrodes, a third voltage and a fourth voltage are applied to a portion of adjacent two second electrodes.

The invention provides a micro device transfer apparatus including a carrier substrate and a receiving substrate. The carrier substrate is adapted to carry a plurality of micro devices and includes a plurality of first electrodes, where the micro devices are separated from each other and respectively electrically connected to the first electrodes. The adjacent two first electrodes are adapted to receive a first voltage and a second voltage, and the first voltage is different to the second voltage. The receiving substrate includes a plurality of second electrodes, where the second electrodes and the first electrodes are opposite in electrical property, and the adjacent two second electrodes are adapted to receive a third voltage and a fourth voltage.

In an embodiment of the invention, each of the micro devices is a light emitting diode.

In an embodiment of the invention, the first voltage and the second voltage are the same or opposite in electrical property.

In an embodiment of the invention, the carrier substrate has a first surface and a second surface opposite to each other, the second surface is located adjacent to the receiving substrate, and the micro devices are disposed on the second surface, and the first electrodes are disposed on the first surface or the second surface, or a part of the first electrodes is disposed on the first surface, and another part of the first electrodes is disposed on the second surface.

In an embodiment of the invention, the receiving substrate has a third surface and a fourth surface opposite to each other, the fourth surface is located adjacent to the carrier substrate, and the second electrodes are disposed on the third surface or the fourth surface, or a part of the second electrodes is disposed on the third surface, and another part of the second electrodes is disposed on the fourth surface.

In an embodiment of the invention, the receiving substrate is further configured with a plurality of transfer heads, and the transfer heads respectively and directly contact the micro devices.

In an embodiment of the invention, the carrier substrate is a sapphire substrate, and the receiving substrate is a glass substrate.

In an embodiment of the invention, the carrier substrate is a glass substrate, and the receiving substrate is a driving substrate.

In an embodiment of the invention, the adjacent two second electrodes are adapted to receive a third voltage and a fourth voltage.

In an embodiment of the invention, one of the first electrodes receiving the second voltage is surrounded by a plurality of the first electrodes receiving the first voltage.

According to the above description, in the method of transferring micro devices of the present invention, after the receiving substrate and the carrier substrate relatively close to each other, the first voltage and the second voltage of different levels are applied to the adjacent first electrodes, such that the micro devices are released from the carrier substrate to the receiving substrate and bonded to the receiving substrate to complete the operation of transferring the micro devices. Namely, when the micro devices are transferred, the carrier substrate assumes a charged state. In this way, by applying different voltages to the adjacent two first electrodes, alignment accuracy in the transfer process is improved to decrease a transfer error, so as to achieve an effect of high alignment accuracy.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
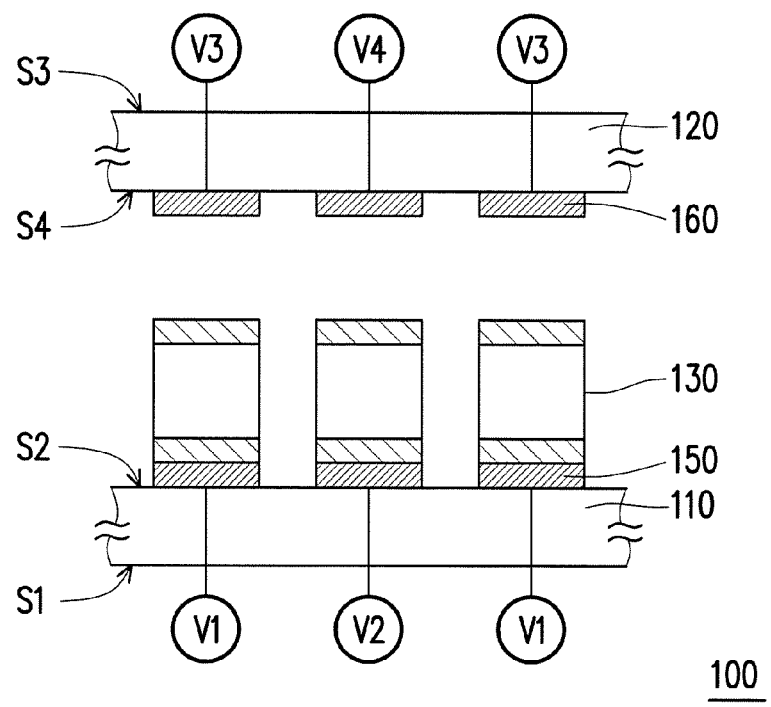
FIG. 1A to FIG. 1C are cross-sectional views of a method of transferring micro devices according to an embodiment of the invention.
Figure 1B:
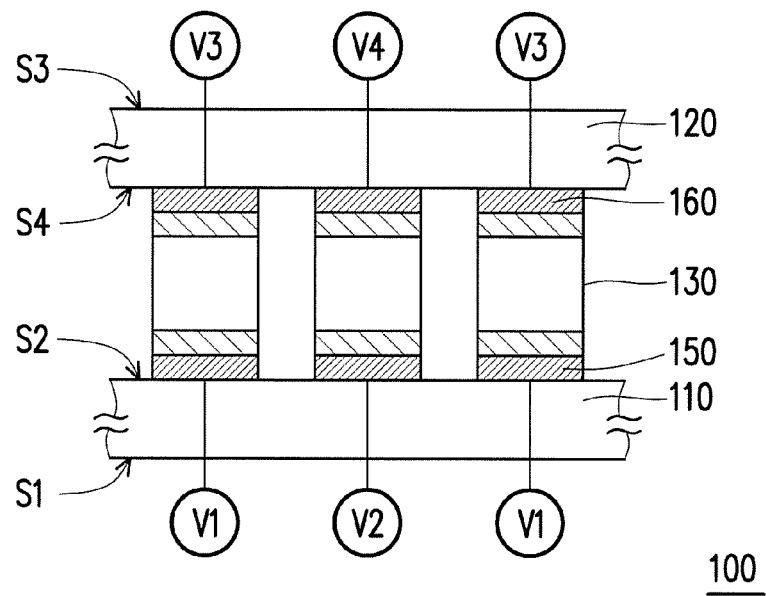
Figure 1C:
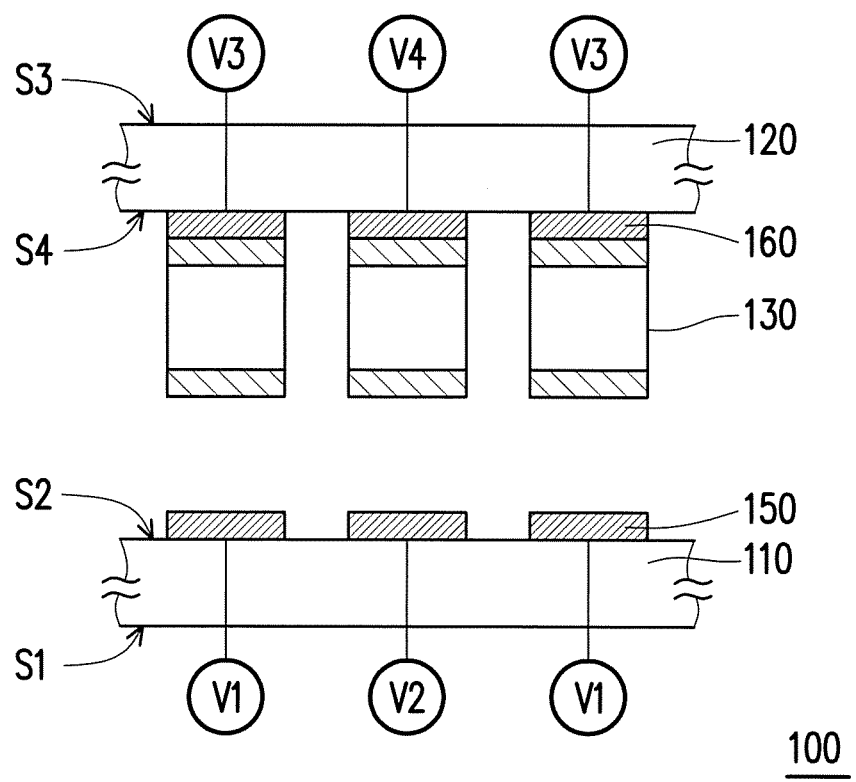
Figure 1D:
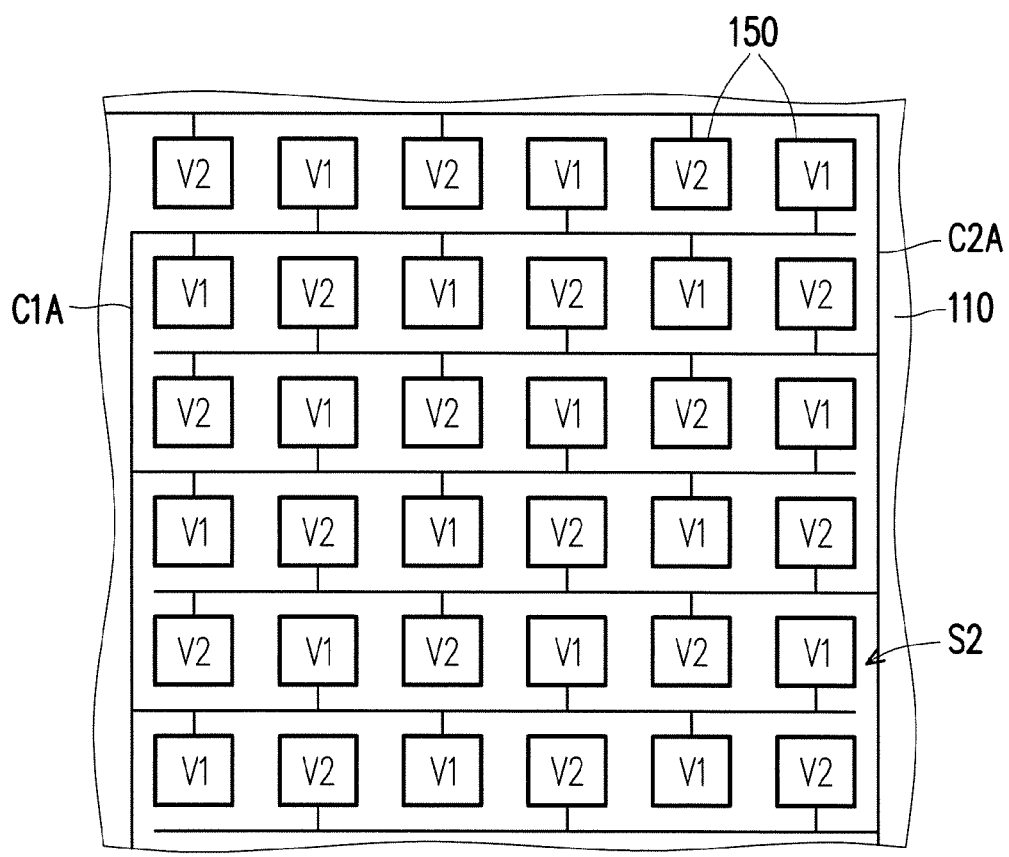
FIG. 1D and FIG. 1E are respectively top views of a carrier substrate and a receiving substrate of FIG. 1A.
Figure 1E:
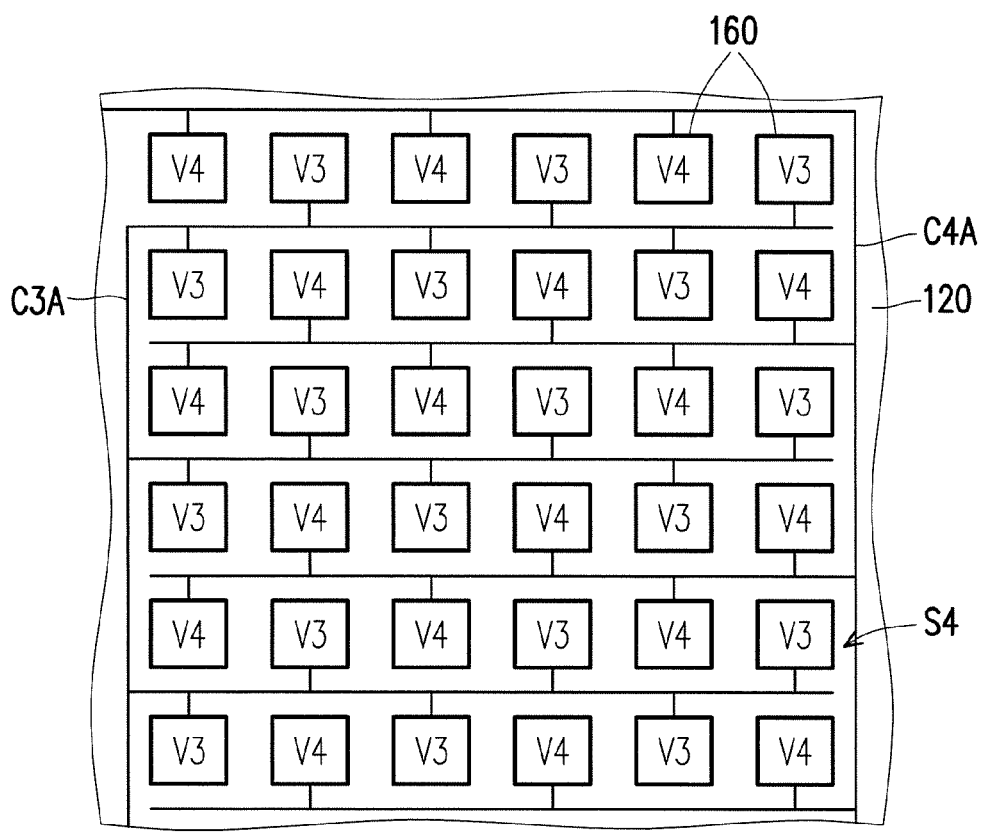

FIG. 1A to FIG. 1C are cross-sectional views of a method of transferring micro devices according to an embodiment of the invention. FIG. 1D and FIG. 1E are respectively top views of a carrier substrate and a receiving substrate of FIG. 1A. For simplicity's sake, micro devices 130 are omitted in FIG. 1D. Referring to FIG. 1A and FIG. 1D first, according to the method of transferring micro devices of the invention, a carrier substrate 110 is provided, where the carrier substrate 110 is configured with a plurality of first electrodes 150 and a plurality of micro devices 130. The carrier substrate 110 has a first surface S1 and a second surface S2 opposite to each other, the first electrodes 150 and the micro devices 130 are disposed on the second surface S2, and the micro devices 130 are separated from each other and respectively electrically connected to the first electrodes 150. The carrier substrate 110 is, for example, a sapphire substrate, and each of the micro devices 130 is a light emitting diode (LED), though the invention is not limited thereto.

Then, referring to FIG. 1A and FIG. 1E, a receiving substrate 120 is provided, and the receiving substrate 120 is made to relatively close to the carrier substrate 110, where the receiving substrate 120 is configured with a plurality of second electrodes 160. The receiving substrate 120 has a third surface S3 and a fourth surface S4 opposite to each other, where the fourth surface S4 is opposite to the second surface S2 of the carrier substrate 110, and the second electrodes 160 are separated from each other and disposed on the fourth surface S4. Particularly, the second electrodes 160 and the first electrodes 150 are opposite in electrical property. The receiving substrate 120 is, for example, a glass substrate, though the invention is not limited thereto.

Then, referring to FIG. 1B and FIG. 1C, a first voltage V1 and a second voltage V2 are applied to the adjacent two first electrodes 150, and a third voltage V3 and a fourth voltage V4 are applied to the adjacent two second electrodes 160, such that the micro devices 130 are released from the carrier substrate 110 to the receiving substrate 120 and bonded to the receiving substrate 120, where the first voltage V1 is different to the second voltage V2.

Due to the difference of the first voltage V1 and the second voltage V2, each of the first electrodes 150 has a different attraction force on the corresponding one micro device 130, by which alignment accuracy in a transfer process is improved to decrease a transfer error, so as to achieve a characteristic of having higher alignment accuracy. Moreover, since the second electrodes 160 and the first electrodes 150 are opposite in electrical property, each of the micro devices 130 disposed on the carrier substrate 110 is attracted by each of the second electrodes 160 disposed on the receiving substrate 120, so as to implement the micro device transfer. In detail, by applying the different voltages to the corresponding two electrodes, an electric field of a specific direction is produced between the corresponding two electrodes, and the micro devices 130 are guided to a specific direction under the influence of the electric field. Moreover, regarding a method of applying the voltages, besides the voltages can be directly provided to the electrodes, induced voltage can be produced through a method of electromagnetic coil induction, though the invention is not limited thereto.

To be specific, the first voltage V1 and the second voltage V2 of the present embodiment are the same in electrical property, for example, the first voltage V1 and the second voltage V2 are all positive voltages, though a voltage value of the first voltage V1 is different to a voltage value of the second voltage V2. Alternatively, the first voltage V1 and the second voltage V2 are opposite in electrical property, for example, the first voltage V1 is a positive voltage, and the second voltage V2 is a negative voltage, though the voltage value of the first voltage V1 can be the same or different to the voltage value of the second voltage V2. For example, when the first voltage V1 is the positive voltage, and the second voltage V2 is the positive voltage, the third voltage V3 is the negative voltage, and the fourth voltage V4 is the negative voltage, and the micro devices 130 can be transferred through a variation of the voltage difference between the first voltage V1 and the second voltage V2. On the other hand, when the first voltage V1 is the positive voltage, and the second voltage V2 is the negative voltage, the third voltage V3 is the negative voltage, and the fourth voltage V4 is the positive voltage, and the alignment accuracy of the second electrodes 160 and the micro devices 130 can be further improved to decrease errors occurred in the transfer process.

Referring to FIG. 1D, the first electrodes 150 disposed on the second surface S2 of the carrier substrate 110 can be respectively electrically connected to other first electrodes 150 applied with the same voltage to form a line C1A and a line C2A according to the first voltage V1 and the second voltage V2 applied thereto. In this way, a part of the first electrodes 150 can be simultaneously applied with the first voltage V1 through the line C1A, and the other part of the first electrodes 150 can be simultaneously applied with the second voltage V2 through the line C2A, so that the voltages can be effectively supplied to the first electrodes 150. Similarly, referring to FIG. 1E, the second electrodes 160 disposed on the fourth surface S4 of the receiving substrate 120 can be respectively electrically connected to other second electrodes 160 applied with the same voltage to form a line C3A and a line C4A according to the third voltage V3 and the fourth voltage V4 applied thereto. In this way, a part of the second electrodes 160 can be simultaneously applied with the third voltage V3 through the line C3A, and the other part of the second electrodes 160 can be simultaneously applied with the fourth voltage V4 through the line C4A, so that the voltages can be effectively supplied to the second electrodes 160.

It should be noted that besides the aforementioned method of applying the voltages, in other embodiments, a plurality of different voltage values can be preset for applying to the first electrodes 150 and the second electrodes 160. Namely, the first electrodes 150 on the carrier substrate 110 may receive voltages with the same electrical property and different voltages values, voltages with different electrical properties and the same or different voltages values, or voltages with partially the same electrical property and different voltage values. Similarly, the second electrodes 160 on the receiving substrate 120 may receive voltages with the same electrical property and different voltages values, voltages with different electrical properties and the same or different voltages values, or voltages with partially the same electrical property and different voltage values. In brief, the first electrodes 150 and the second electrodes 160 may achieve the purpose of transferring the micro devices 130 through the diversified matches of electrical properties and voltage values.

Moreover, in other embodiments that are not illustrated, arrangement of the voltages applied to the electrodes can be progressive voltage arrangement, for example, the voltage is progressively increased or progressively decreased. In this way, through a progressive guiding effect of the electrodes on the micro device 130, a shift phenomenon occurred during the transfer process due to transient electric field instability caused by non-synchronization of the signals between the electrodes and the micro devices 130 is avoided, such that occurrence of the transfer shift is minimized to improve the alignment accuracy.

Moreover, in other embodiments that are not illustrated, arrangement of the voltages applied to the electrodes can be a multiple voltage level arrangement, for example, the voltage is first increased and then decreased, or first decreased and then increased. In this way, after a high voltage or a low voltage is applied to the electrodes or a transfer head (referring to 140 of FIG. 3), or when electrostatic charges are adsorbed to the electrodes or the transfer head due to an ambient environment, voltages with opposite electrical properties can be provided to eliminate the residual charges through the multiple voltage level arrangement, so as to facilitate smooth proceeding of a next transfer process.

In view of a structure, referring to FIG. 1B, the micro device transfer apparatus 100 of the present embodiment includes the carrier substrate 110 and the receiving substrate 120. The carrier substrate 110 is adapted carry the micro devices 130 and includes the first electrode 150, where the micro devices 130 are separated from each other and respectively electrically connected to the first electrodes 150. The adjacent two first electrodes 150 are adapted to receive the first voltage V1 and the second voltage V2 different from each other. The receiving substrate 120 includes the second electrodes 160, where the second electrodes 160 and the first electrodes 150 are opposite in electrical property, and the adjacent two second electrodes 160 are adapted to receive the third voltage V3 and the fourth voltage V4.

Although the aforementioned carrier substrate 110 and the receiving substrate 120 are respectively a sapphire substrate and a glass substrate, in other embodiments, the carrier substrate 110 can also be a glass substrate, and the receiving substrate 120 can be a driving substrate. In other words, after the micro devices 130 are transferred to the receiving substrate 120, the receiving substrate 120 may serve as the carrier substrate 110 in another process of transferring the micro devices 130, so that the micro devices 130 can be transferred to another receiving substrate 120 (i.e. the driving substrate, for example, a thin-film transistor (TFT) substrate) through the same transfer process for driving the micro devices 130.

It should be noted that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 2:
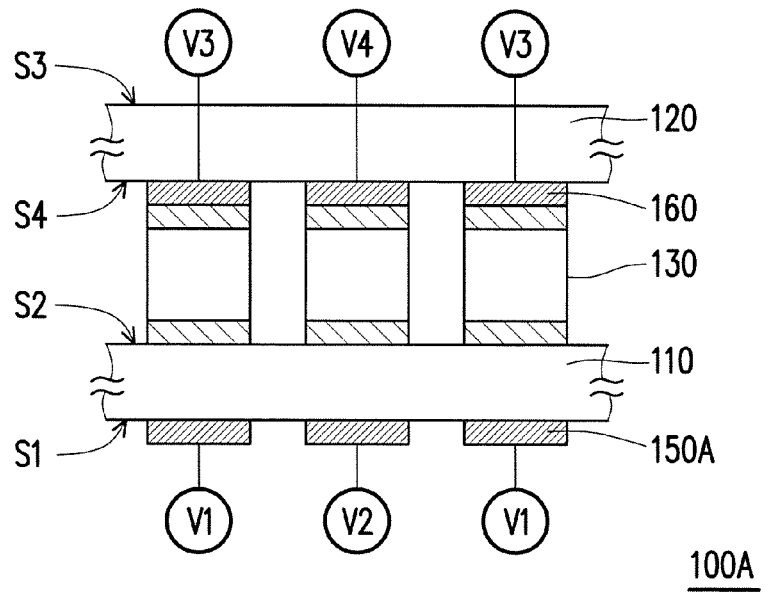
FIG. 2 is a cross-sectional view of a micro device transfer apparatus according to another embodiment of the invention.

FIG. 2 is a cross-sectional view of a micro device transfer apparatus according to another embodiment of the invention. Referring to FIG. 1B and FIG. 2, the micro device transfer apparatus 100A of the present embodiment is similar to the micro device transfer apparatus 100 of FIG. 1B, and a difference there between is that the micro devices 130 of the present embodiment are disposed on the second surface S2 of the carrier substrate 110, and the first electrodes 150A are disposed on the first surface S1. In other words, in the micro device transfer apparatus 100A, the first electrodes 150A disposed on the carrier substrate 110 can be provided by an external electrode carrier. Electrical connection of the first electrodes 150A and the micro devices 130 is, for example, implemented by configuring conductive through vias on the carrier substrate 110 to electrically connect the first electrodes 150A and the micro devices 130, or external electrodes and the micro device 130 may form capacitors to produce induced voltages, and the electrical connection method and the method for generating the induced voltages are not limited by the invention.

Figure 3:
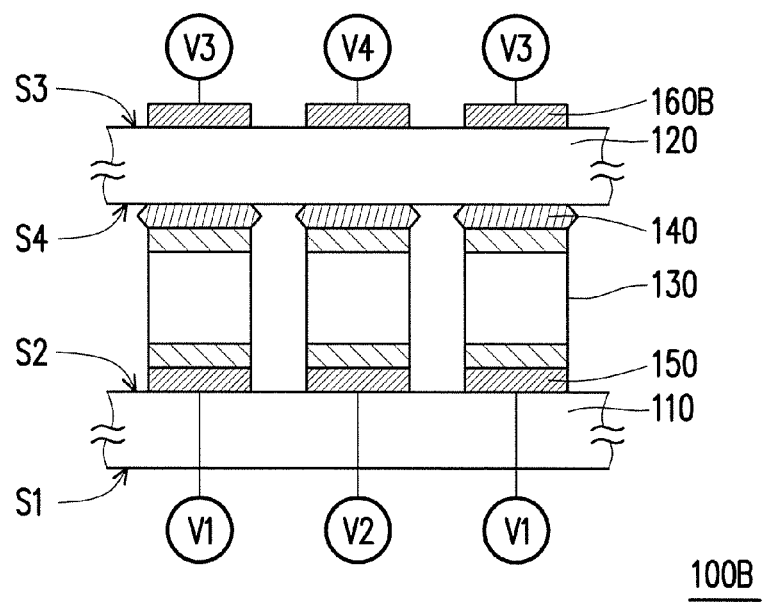
FIG. 3 is a cross-sectional view of a micro device transfer apparatus according to another embodiment of the invention.

FIG. 3 is a cross-sectional view of a micro device transfer apparatus according to another embodiment of the invention. Referring to FIG. 1B and FIG. 3, the micro device transfer apparatus 100B of the present embodiment is similar to the micro device transfer apparatus 100 of FIG. 1B, and a difference there between is that the second electrodes 160B of the present embodiment are disposed on the third surface S3 of the receiving substrate 120. Besides, in the present embodiment, the receiving substrate 120 is further configured with a plurality of transfer heads 140, where the transfer heads 140 respectively directly contact the micro devices 130, and each of the second electrodes 160B is respectively electrically connected to each of the transfer heads 140. In other words, in the micro device transfer apparatus 100B, the second electrodes 160B disposed on the receiving substrate 120 can be provided by an external electrode carrier. In this way, the second electrodes 160B disposed on the third surface S3 can be electrically connected to the transfer heads 140 disposed on the fourth surface S4, so that the micro devices 130 are adsorbed by the transfer heads 140 and released from the carrier substrate 110 to the receiving substrate 120 and bonded to the receiving substrate 120 to complete transferring the micro devices 130.

Figure 4:
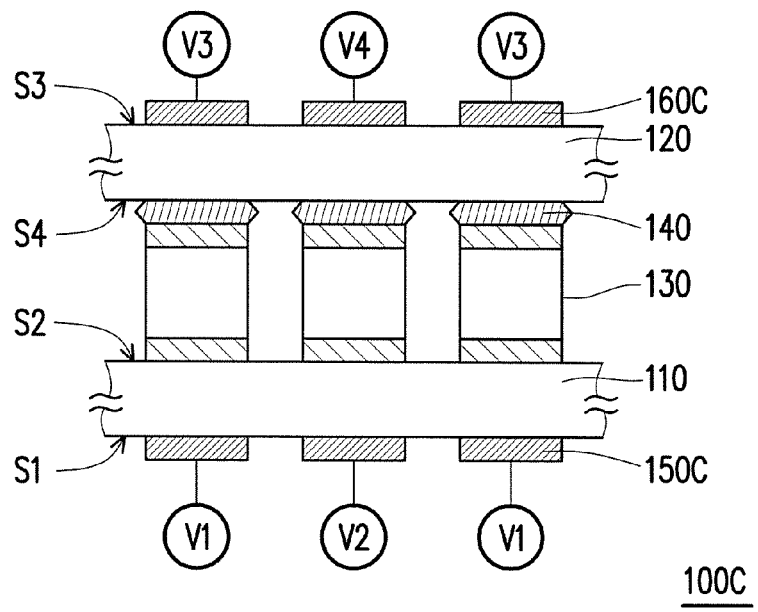
FIG. 4 is a cross-sectional view of a micro device transfer apparatus according to another embodiment of the invention.

FIG. 4 is a cross-sectional view of a micro device transfer apparatus according to another embodiment of the invention. Referring to FIG. 3 and FIG. 4, the micro device transfer apparatus 100C of the present embodiment is similar to the micro device transfer apparatus 100B of FIG. 3, and a difference there between is that the first electrodes 150C of the present embodiment are disposed on the first surface S1 of the carrier substrate 110. In other words, in the micro device transfer apparatus 100C, the first electrodes 150C disposed on the carrier substrate 110 and the second electrodes 160C disposed on the receiving substrate 120 can all be provided by external electrode carriers, so as to achieve the effect of releasing the micro devices 130 from the carrier substrate 110 to the receiving substrate 120 and bonding the same to the receiving substrate 120.

Figure 5:
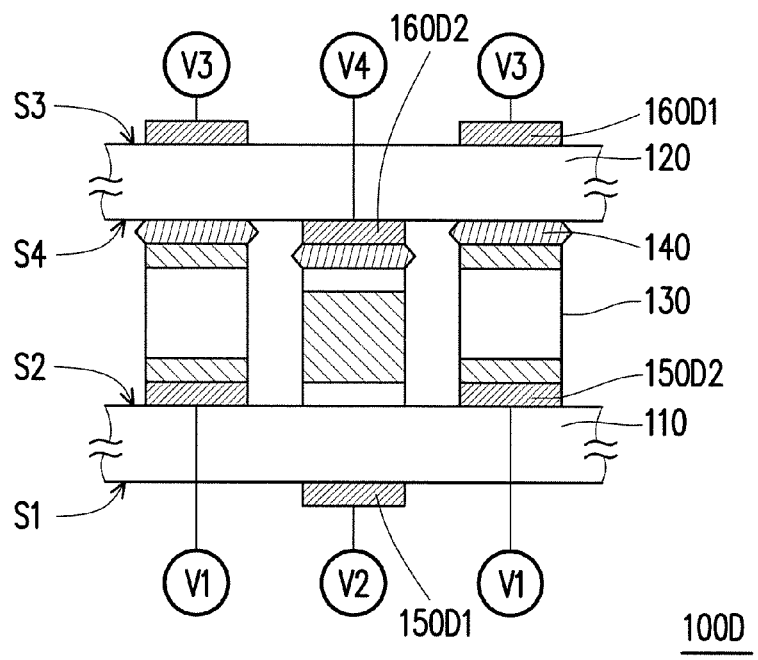
FIG. 5 is a cross-sectional view of a micro device transfer apparatus according to another embodiment of the invention.

FIG. 5 is a cross-sectional view of a micro device transfer apparatus according to another embodiment of the invention. Referring to FIG. 3 and FIG. 5, the micro device transfer apparatus 100D of the present embodiment is similar to the micro device transfer apparatus 100B of FIG. 3, and a difference there between is that the first electrodes 150D1 of the present embodiment are disposed on the first surface S1, and the first electrodes 150D2 are disposed on the second surface S2. The second electrodes 160D1 are disposed on the third surface S3, and the second electrodes 160D2 are disposed on the fourth surface S4. In this way, voltages can be respectively provided to the first electrodes 150D1 and the first electrodes 150D2 through the carrier substrate 110 and an external electrode carrier, and voltages can be respectively provided to the second electrodes 160D1 and the second electrodes 160D2 through the receiving substrate 120 and an external electrode carrier, so as to save a power supplying amount of the carrier substrate 110 and the receiving substrate 120.

Figure 6A:
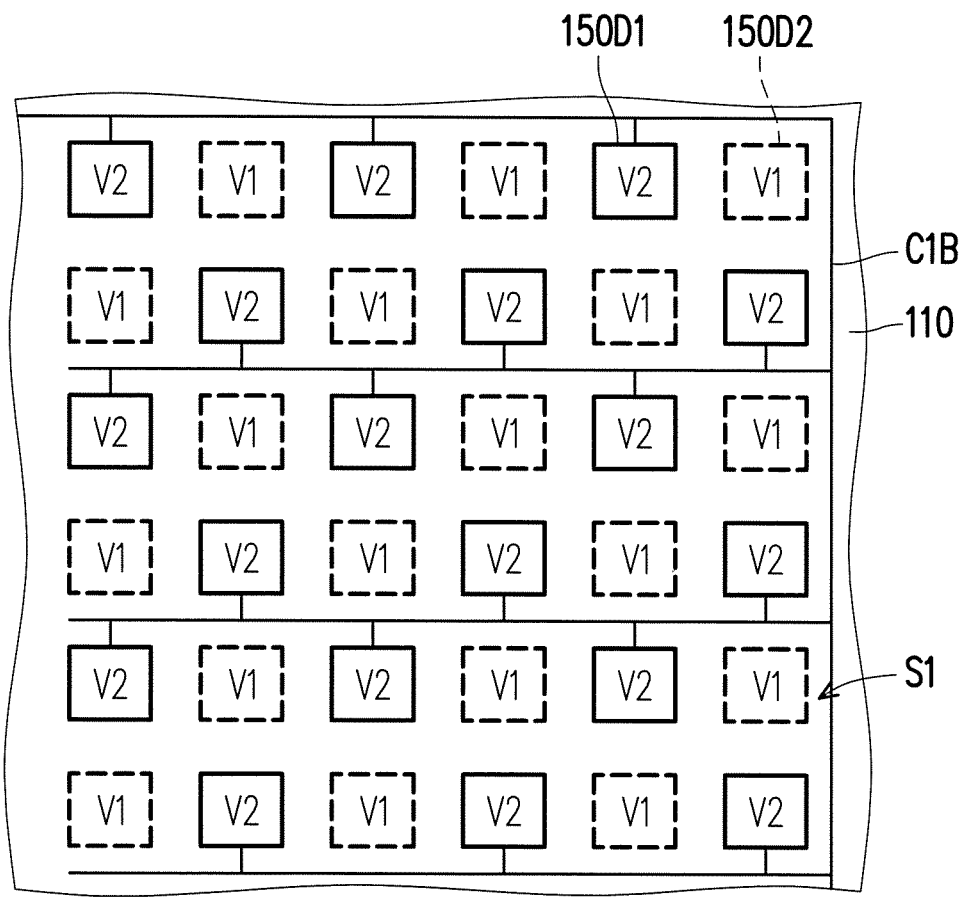
FIG. 6A to FIG. 6B are respectively a bottom view and a top view of a carrier substrate of the micro device transfer apparatus of FIG. 5.
Figure 6B:
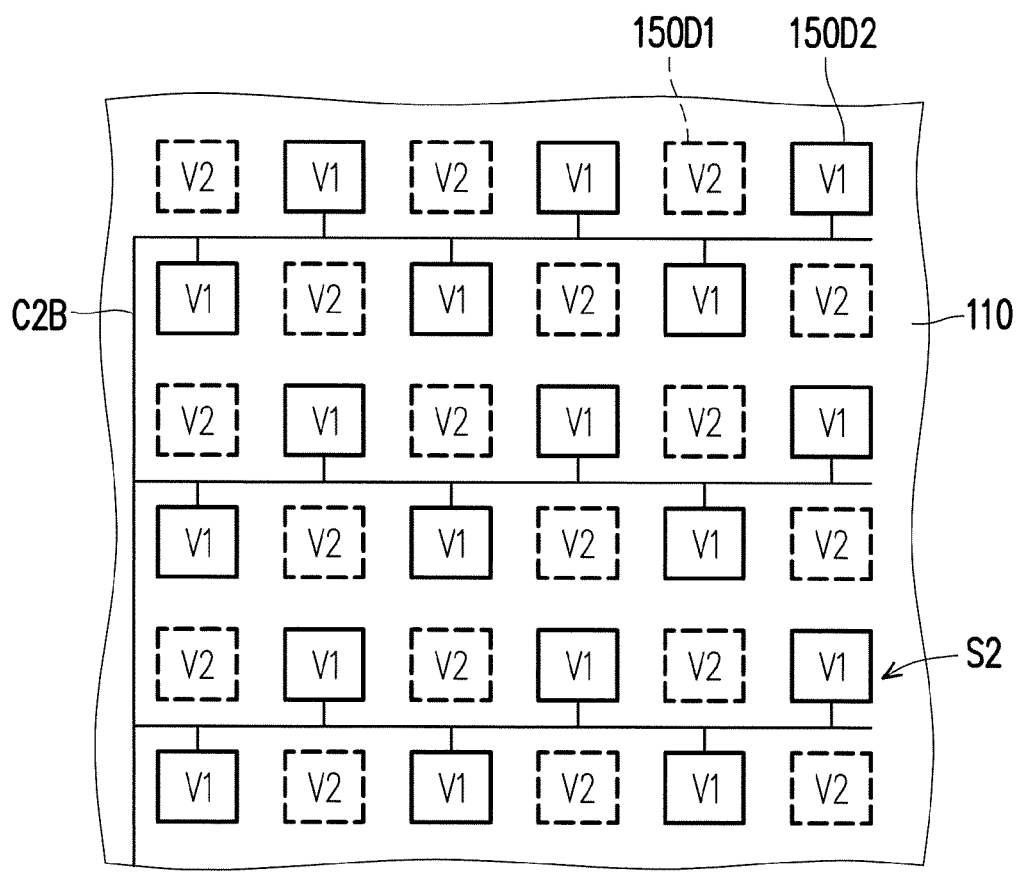

FIG. 6A to FIG. 6B are respectively a bottom view and a top view of the carrier substrate of the micro device transfer apparatus of FIG. 5. Referring to FIG. 5, FIG. 6A and FIG. 6B, in the present embodiment, the first electrodes 150D1 disposed on the first surface S1 of the carrier substrate 110 and the first electrodes 150D2 disposed on the second surface S2 of the carrier substrate 110 respectively form a line C1B and a line C2B. In this way, the first electrodes 150D1 and the first electrodes 150D2 respectively disposed on the first surface S1 and the second surface S2 can be applied with the first voltage V1 and the second voltage V2 through the line C1B and the line C2B.

Figure 6C:
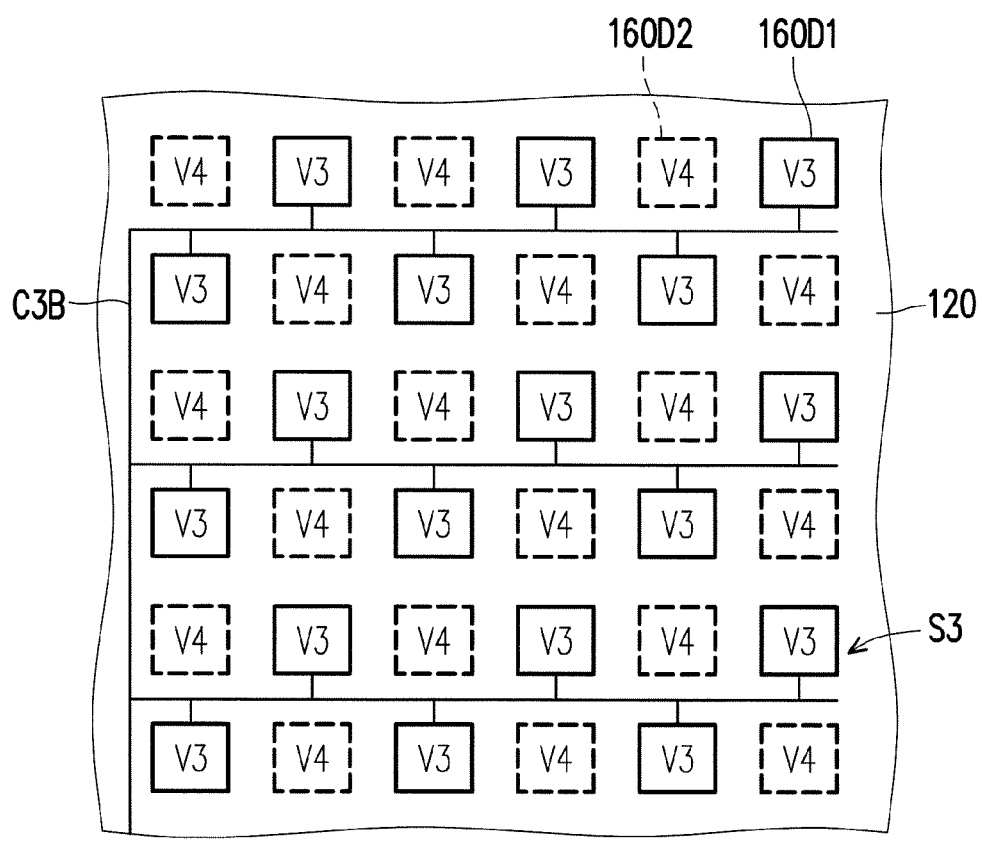
FIG. 6C to FIG. 6D are respectively a bottom view and a top view of a receiving substrate of the micro device transfer apparatus of FIG. 5.
Figure 6D:
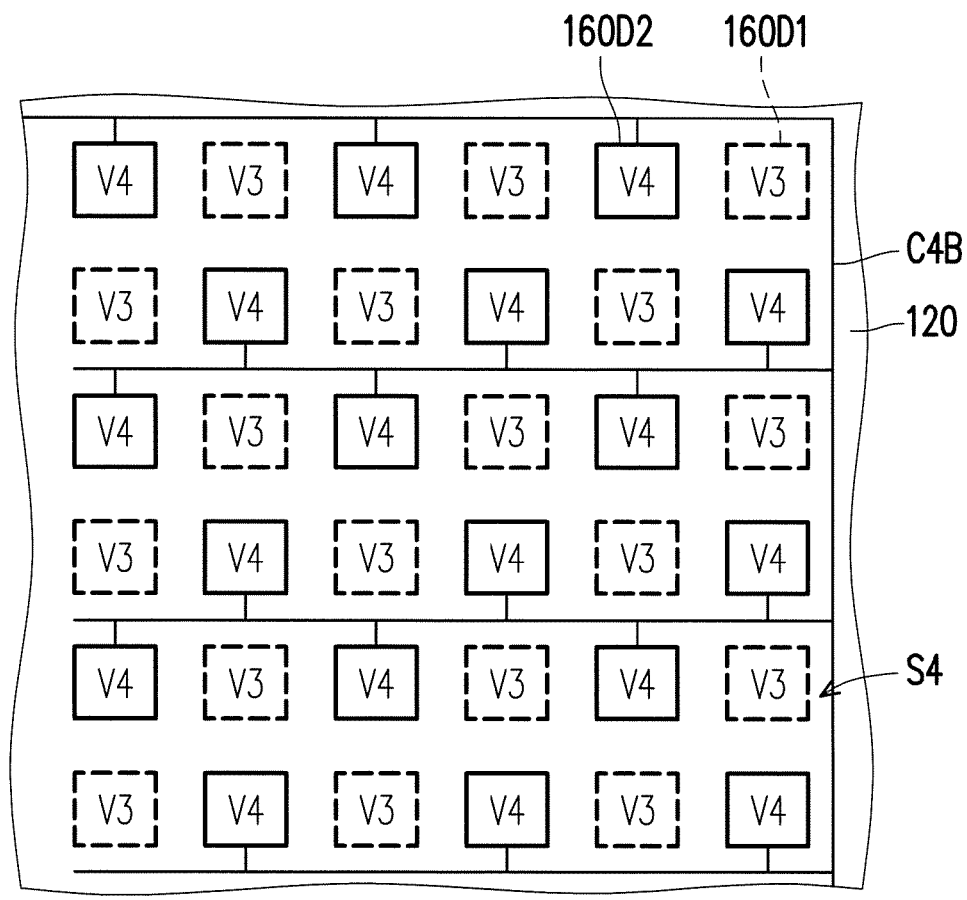

Similarly, FIG. 6C to FIG. 6D are respectively a bottom view and a top view of the receiving substrate of the micro device transfer apparatus of FIG. 5. Referring to FIG. 5, FIG. 6C and FIG. 6D, in the present embodiment, the second electrodes 160D1 disposed on the third surface S3 of the receiving substrate 120 and the second electrodes 160D2 disposed on the fourth surface S4 of the receiving substrate 120 respectively form a line C3B and a line C4B. In this way, the second electrodes 160D1 and the second electrodes 160D2 respectively disposed on the third surface S3 and the fourth surface S4 can be applied with the third voltage V3 and the fourth voltage V4 through the line C3B and the line C4B.

Moreover, in other embodiments that are not illustrated, technicians of the field may also design circuit layouts on the carrier substrate and the receiving substrate according to principles of applying the first voltage and the second voltage to the adjacent first electrodes, where the first voltage is different to the second voltage, and the second electrodes and the first electrodes are opposite in electrical property, etc. with reference of the descriptions of the aforementioned embodiments, so as to achieve the required technical effects.

Figure 7A:
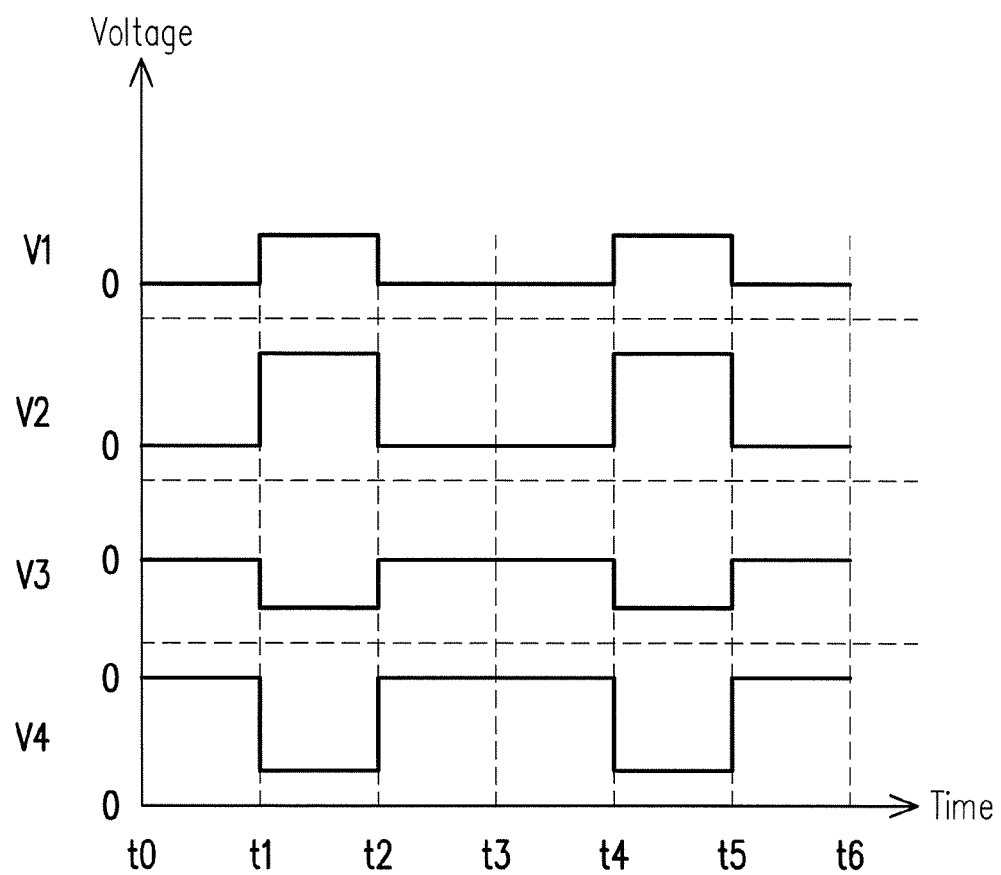
FIG. 7A and FIG. 7B are schematic diagrams illustrating variations of voltages along with time when the voltages are applied to the micro device transfer apparatus according to another embodiment of the invention.
Figure 7B:
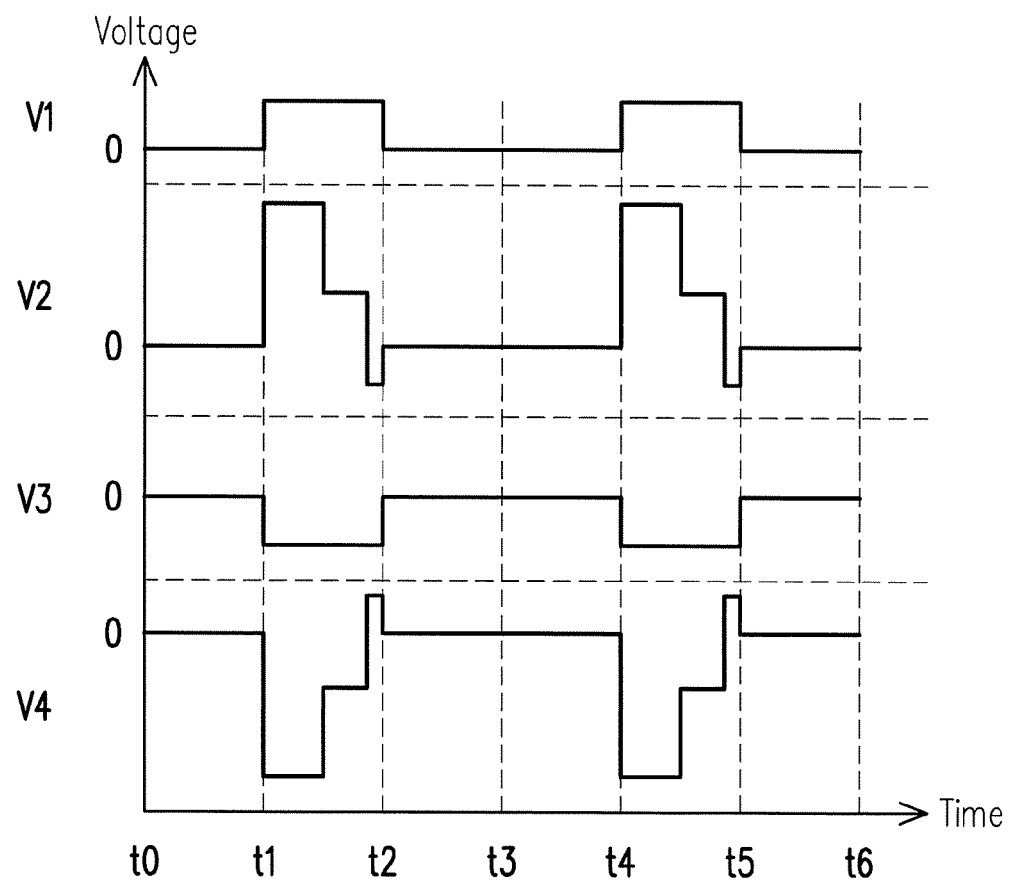
Figure 8A:
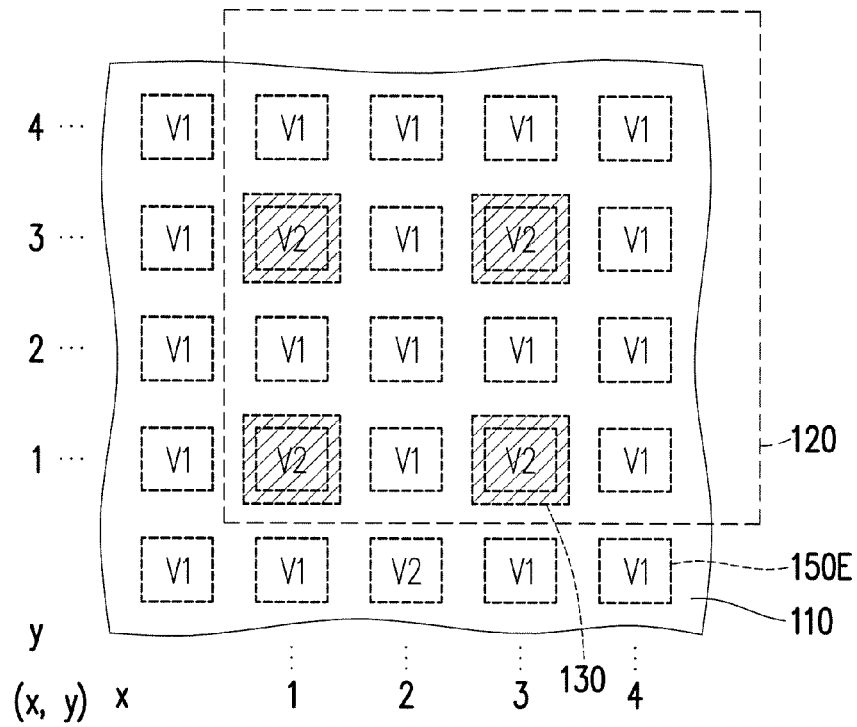
FIG. 8A to FIG. 8D are bottom views of a method of transferring micro devices according to another embodiment of the invention.
Figure 8B:
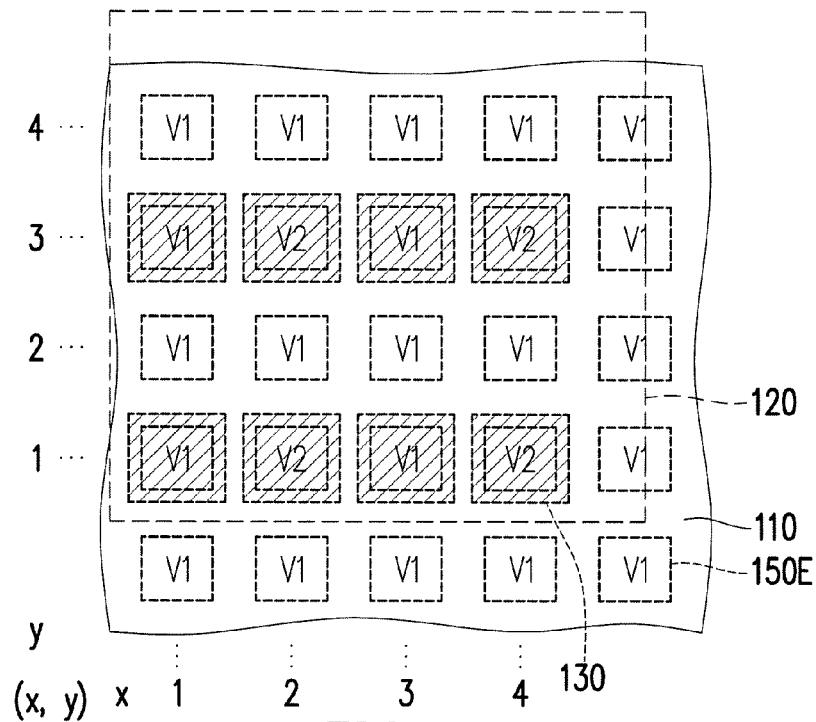
Figure 8C:
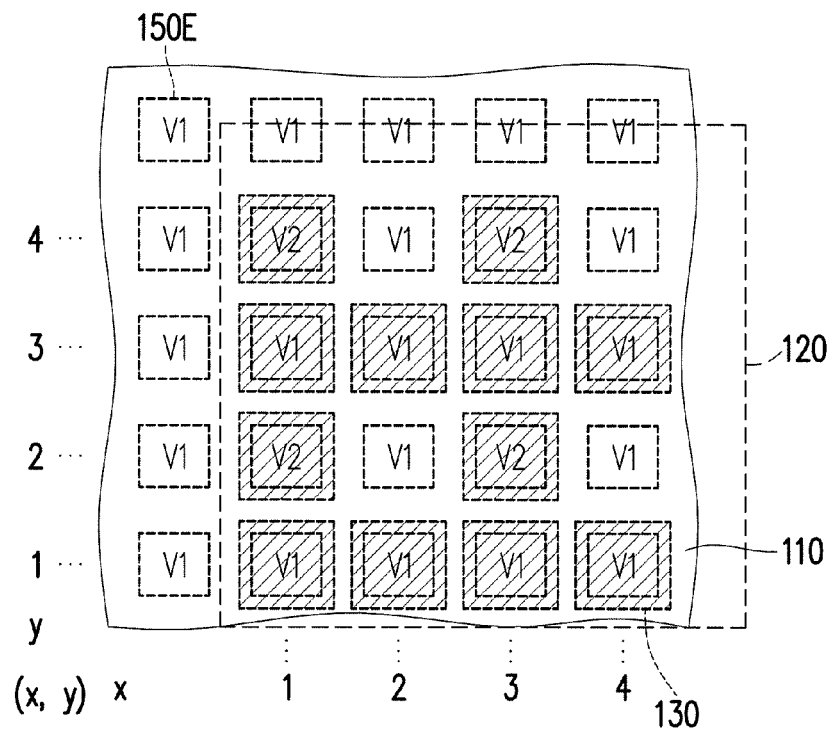
Figure 8D:
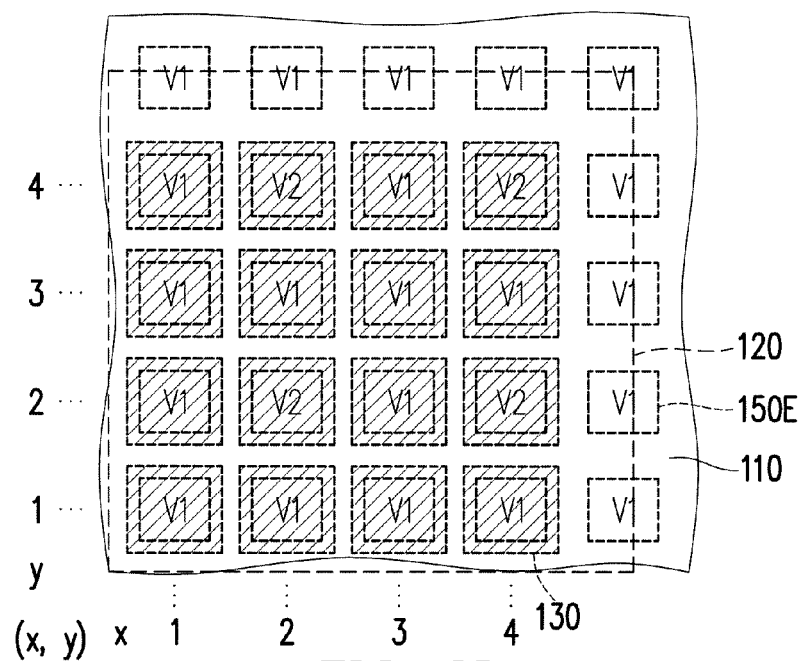

FIG. 7A and FIG. 7B are schematic diagrams illustrating variations of voltages along with time when the voltages are applied to the micro device transfer apparatus according to another embodiment of the invention. Referring to FIG. 1B and FIG. 7A, in the present embodiment, the method of applying voltages to the corresponding electrodes of FIG. 7A can be applied to the micro device transfer apparatus 100 of FIG. 1B. In other words, in the present embodiment, regarding the operation of applying the first voltage V1 and the second voltage V2 to the first electrodes 150, and applying the third voltage V3 and the fourth voltage V4 to the second electrodes 160, the voltages can be applied to or stopped being applied to each of the electrodes along with time. For example, during the transfer process, the first voltage V1 of a fixed value and the second voltage V2 greater than the first voltage V1 are applied to the first electrodes 150, and the third voltage V3 of a fixed value and the fourth voltage V4 smaller than the third voltage V3 are applied to the second electrodes 160. After the transfer process is completed, the voltages are stopped being applied to each of the electrodes to continue a transfer process of a next stage, as that shown in FIG. 7A.

Referring to FIG. 1B, FIG. 7A and FIG. 7B, in the present embodiment, the method of applying voltages to the corresponding electrodes of FIG. 7B can be applied to the micro device transfer apparatus 100 of FIG. 1B. In other words, compared to the method of applying voltages of FIG. 7A, the method of applying voltages of FIG. 7B may further change a magnitude of the applied voltage along with time during the same transfer process. For example, in the transfer process, the first voltage V1 of a fixed value is applied to the first electrodes 150 and the third voltage V3 of a fixed value is applied to the second electrodes 160, and the second voltage V2 varied along with time is applied to the first electrodes 150 and the fourth voltage V4 varied along with time is applied to the second electrodes 160, by which the alignment accuracy of the second electrodes 160 and the micro devices 130 is further improved to decrease the errors in the transfer process.

FIG. 8A to FIG. 8D are bottom views of a method of transferring micro devices according to another embodiment of the invention. Referring to FIG. 8A to FIG. 8D, in the invention, the first voltage V1 and the second voltage V2 can only be applied to a portion of the adjacent two first electrodes 150E, so that the micro devices 130 are released from the carrier substrate 110 to the receiving substrate 120 and bonded to the receiving substrate 120. For example, in the present embodiment, one of the first electrodes 150E receiving the second voltage V2 is surrounded by the first electrodes 150E receiving the first voltage V1. Therefore, in the transfer process, transfer of the micro devices 130 located at positions (1,1), (1,3), (3,1) and (3,3) can be first performed, as that shown in FIG. 8A. Then, transfer of the micro devices 130 located at positions (2,1), (2,3), (4,1) and (4,3) are performed, as that shown in FIG. 8B. Then, transfer of the micro devices 130 located at positions (1,2), (1,4), (3,2) and (3,4) are performed, as that shown in FIG. 8C. Finally, transfer of the micro devices 130 located at positions (2,2), (2,4), (4,2) and (4,4) are performed, as that shown in FIG. 8D, so as to complete transferring the micro devices 130. In this way, transfer of the micro devices 130 can be implemented by only applying a single-side voltage.

Figure 9A:
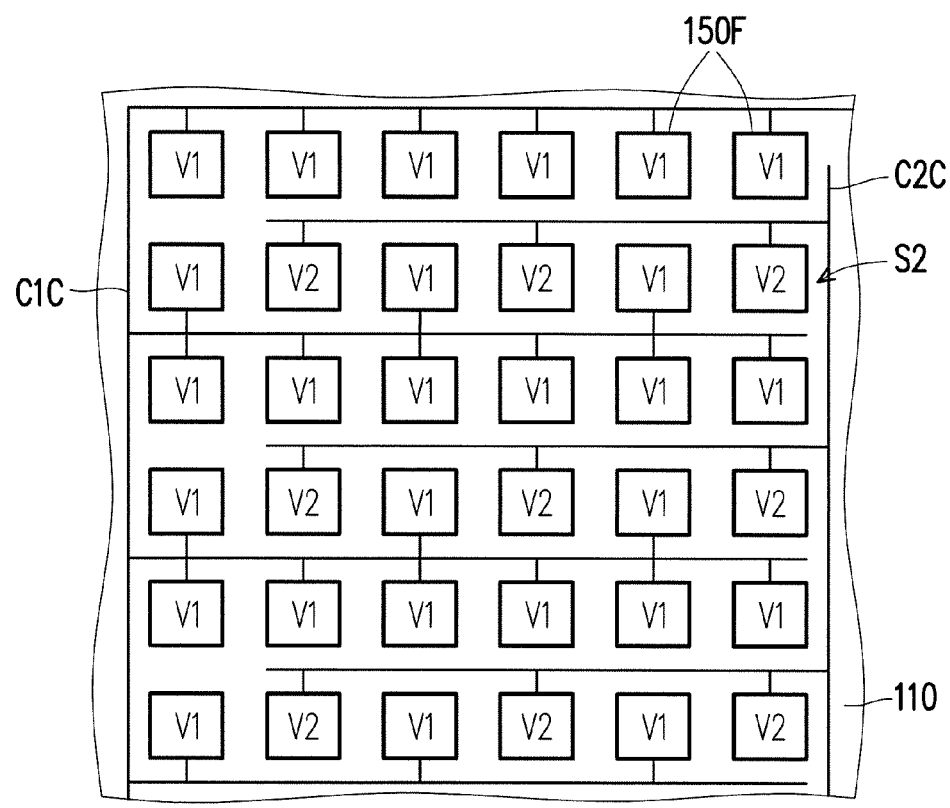
FIG. 9A and FIG. 9B are top views of a carrier substrate and a receiving substrate of a micro device transfer apparatus according to another embodiment of the invention.
Figure 9B:
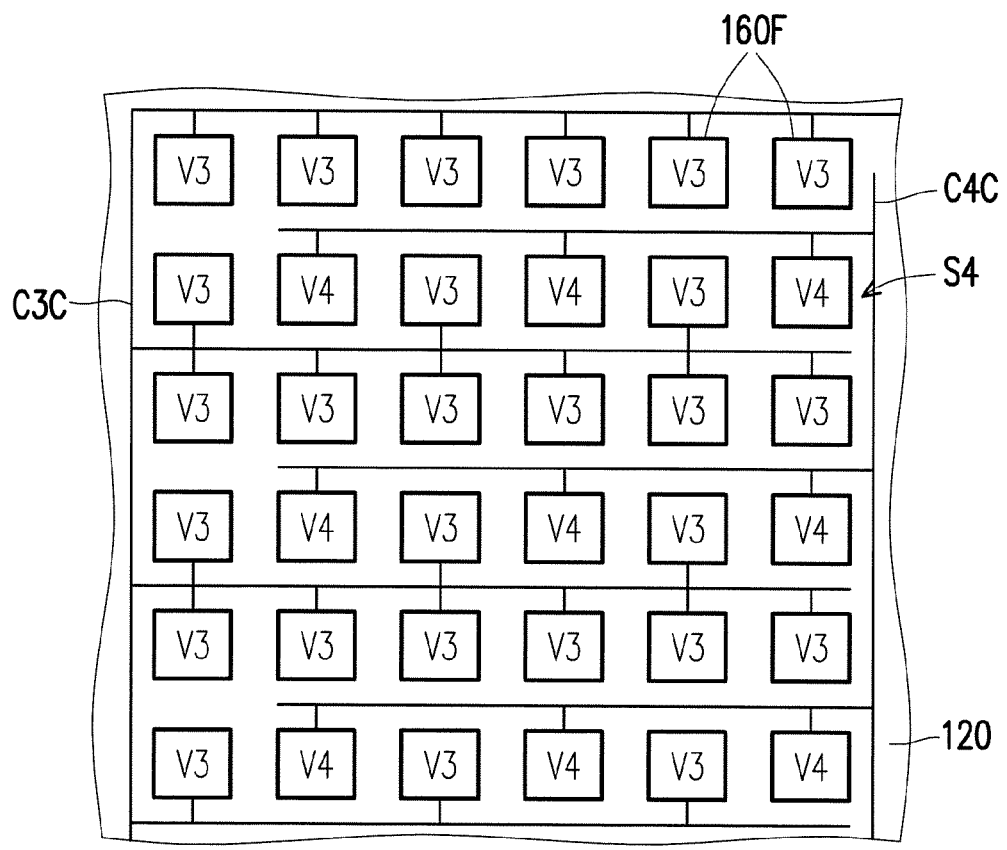

In the transfer process of the micro devices 130 shown in FIG. 8A to FIG. 8D, four transfer steps (i.e. voltages are applied by four times) are adopted to complete the transfer with high accuracy, though the invention is not limited thereto. FIG. 9A and FIG. 9B are top views of the carrier substrate and the receiving substrate of the micro device transfer apparatus according to another embodiment of the invention. Referring to FIG. 9A and FIG. 9B, the first electrodes 150F disposed on the second surface S2 of the carrier substrate 110 can be respectively electrically connected to other first electrodes 150F applied with the same voltage to form a line C1C and a line C2C according to the first voltage V1 and the second voltage V2 applied thereto. Similarly, the second electrodes 160F disposed on the fourth surface S4 of the receiving substrate 120 can be respectively electrically connected to other second electrodes 160F applied with the same voltage to form a line C3C and a line C4C according to the third voltage V3 and the fourth voltage V4 applied thereto. In this way, a part of the first electrodes 150F is simultaneously applied with the first voltage V1, the other part of the first electrodes 150F is simultaneously applied with the second voltage V2, and a part of the second electrodes 160F is simultaneously applied with the third voltage V3, and the other part of the second electrodes 160F is simultaneously applied with the fourth voltage V4 through the lines.

In summary, in the method of transferring micro devices, after the receiving substrate and the carrier substrate relatively close to each other, the voltages are only applied to the substrate of one side, for example, the first voltage and the second voltage of different voltage values are applied to the adjacent first electrodes; alternatively, the voltages are applied to the substrates of two sides, for example, the first voltage and the second voltage of different voltage values are applied to the adjacent first electrodes, and the third voltage and the fourth voltage are applied to the adjacent second electrodes, such that the micro devices are released from the carrier substrate to the receiving substrate and bonded to the receiving substrate to complete transferring the micro devices. Namely, when the micro devices are transferred, at least one of the electrodes on the carrier substrate and the receiving substrate assumes a charged state. In this way, by applying different voltages to the adjacent two first electrodes, alignment accuracy in the transfer process is improved to decrease a transfer error, so as to achieve an effect of high alignment accuracy.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method of transferring micro devices, comprising:
providing a carrier substrate, the carrier substrate being configured with a plurality of first electrodes and a plurality of micro devices, wherein the micro devices are separated from each other and respectively electrically connected to the first electrodes;
making a receiving substrate to relatively close to the carrier substrate, wherein the receiving substrate is configured with a plurality of second electrodes, and the second electrodes and the first electrodes are opposite in electrical property; and
applying a first voltage and a second voltage to a portion of the adjacent two first electrodes, so that the micro devices are released from the carrier substrate to the receiving substrate and bonded to the receiving substrate, wherein the first voltage is different from the second voltage.

2. The method of transferring micro devices as claimed in claim 1, wherein each of the micro devices is a light emitting diode.

3. The method of transferring micro devices as claimed in claim 1, wherein the first voltage and the second voltage are the same or opposite in electrical property.

4. The method of transferring micro devices as claimed in claim 1, wherein the carrier substrate has a first surface and a second surface opposite to each other, the second surface is located adjacent to the receiving substrate, the micro devices are disposed on the second surface, and the first electrodes are disposed on the first surface or the second surface, or a part of the first electrodes is disposed on the first surface, and another part of the first electrodes is disposed on the second surface.

5. The method of transferring micro devices as claimed in claim 1, wherein the receiving substrate has a third surface and a fourth surface opposite to each other, the fourth surface is located adjacent to the carrier substrate, and the second electrodes are disposed on the third surface or the fourth surface, or a part of the second electrodes is disposed on the third surface, and another part of the second electrodes is disposed on the fourth surface.

6. The method of transferring micro devices as claimed in claim 1, wherein the receiving substrate is further configured with a plurality of transfer heads, and the transfer heads respectively and directly contact the micro devices.

7. The method of transferring micro devices as claimed in claim 1, further comprising:
applying a third voltage and a fourth voltage to a portion of adjacent two second electrodes while applying the first voltage and the second voltage to the portion of the adjacent two first electrodes.

8. A micro device transfer apparatus, comprising:
a carrier substrate, adapted to carry a plurality of micro devices and comprising a plurality of first electrodes, wherein the micro devices are separated from each other and respectively electrically connected to the first electrodes, a portion of the adjacent two first electrodes is adapted to receive a first voltage and a second voltage, and the first voltage is different from the second voltage; and
a receiving substrate, comprising a plurality of second electrodes, wherein the second electrodes and the first electrodes are opposite in electrical property.

9. The micro device transfer apparatus as claimed in claim 8, wherein each of the micro devices is a light emitting diode.

10. The micro device transfer apparatus as claimed in claim 8, wherein the first voltage and the second voltage are the same or opposite in electrical property.

11. The micro device transfer apparatus as claimed in claim 8, wherein the carrier substrate has a first surface and a second surface opposite to each other, the second surface is located adjacent to the receiving substrate, the micro devices are disposed on the second surface, and the first electrodes are disposed on the first surface or the second surface, or a part of the first electrodes is disposed on the first surface, and another part of the first electrodes is disposed on the second surface.

12. The micro device transfer apparatus as claimed in claim 8, wherein the receiving substrate has a third surface and a fourth surface opposite to each other, the fourth surface is located adjacent to the carrier substrate, and the second electrodes are disposed on the third surface or the fourth surface, or a part of the second electrodes is disposed on the third surface, and another part of the second electrodes is disposed on the fourth surface.

13. The micro device transfer apparatus as claimed in claim 8, wherein the receiving substrate is further configured with a plurality of transfer heads, and the transfer heads respectively and directly contact the micro devices.

14. The micro device transfer apparatus as claimed in claim 8, wherein the carrier substrate is a sapphire substrate, and the receiving substrate is a glass substrate.

15. The micro device transfer apparatus as claimed in claim 8, wherein the carrier substrate is a glass substrate, and the receiving substrate is a driving substrate.

16. The micro device transfer apparatus as claimed in claim 8, wherein the adjacent two second electrodes are adapted to receive a third voltage and a fourth voltage.

17. The micro device transfer apparatus as claimed in claim 8, wherein one of the first electrodes receiving the second voltage is surrounded by a plurality of the first electrodes receiving the first voltage.

* * * * *